US008873291B2

(12) United States Patent  
Torricelli et al.

(10) Patent No.: US 8,873,291 B2  
(45) Date of Patent: Oct. 28, 2014

(54) NON-VOLATILE MEMORY DEVICE WITH SINGLE-POLYSILICON-LAYER MEMORY CELLS

(71) Applicant: STMicroelectronics S.r.l., Agrate Brianza (IT)

(72) Inventors: Fabrizio Torricelli, Desenzano del Garda (IT); Luigi Colalongo, Bertinoro (IT); Anna Richelli, Brescia (IT); Zsolt Kovàcs-Vajna, Concesio (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 13/926,280

(22) Filed: Jun. 25, 2013

(65) Prior Publication Data

US 2013/0343128 A1 Dec. 26, 2013

(30) Foreign Application Priority Data

Jun. 25, 2012 (IT) .............................. TO2012A0559

(51) Int. Cl.
| | |
|---|---|
| G11C 11/34 | (2006.01) |
| H01L 29/423 | (2006.01) |
| H01L 29/788 | (2006.01) |
| G11C 16/04 | (2006.01) |

(52) U.S. Cl.  
CPC ...... *G11C 16/0425* (2013.01); *H01L 29/42324* (2013.01); *H01L 29/7881* (2013.01)  
USPC ........ 365/185.14; 365/185; 365/72; 257/315; 257/316; 257/314

(58) Field of Classification Search  
CPC .................. G11C 16/0425; G11C 16/0408  
See application file for complete search history.

(56) References Cited

U.S. PATENT DOCUMENTS

| 8,076,707 | B1 | 12/2011 | Hyde et al. | |
|---|---|---|---|---|
| 2004/0032762 | A1 | 2/2004 | Blanchard | |
| 2008/0232162 | A1* | 9/2008 | Kuan et al. | ................ 365/185.1 |
| 2008/0310237 | A1* | 12/2008 | Zhou et al. | .............. 365/185.29 |
| 2009/0010064 | A1* | 1/2009 | Nazarian | .................. 365/185.17 |
| 2009/0014772 | A1* | 1/2009 | Ratnakumar et al. | ......... 257/315 |
| 2009/0201742 | A1* | 8/2009 | Lee et al. | ................ 365/185.24 |
| 2011/0310669 | A1* | 12/2011 | Ching et al. | ............ 365/185.15 |

OTHER PUBLICATIONS

Search Report for Italian patent application No. TO20120559, The Hague, Holland, Mar. 21, 2013, 2 pages.

* cited by examiner

*Primary Examiner* — Huan Hoang  
*Assistant Examiner* — Muhammad Islam  
(74) *Attorney, Agent, or Firm* — Graybeal Jackson LLP

(57) ABSTRACT

An embodiment of a nonvolatile-memory device includes: a body accommodating at least a first semiconductor well and a second semiconductor well; an insulating structure; and at least one nonvolatile memory cell. The cell includes: at least one first control region in the first well; conduction regions in the second well; and a floating gate region, which extends over portions of the first well and of the second well, is capacitively coupled to the first control region and forms a floating-gate memory transistor with the conduction regions. The insulating structure includes: first insulating regions, which separate the floating gate region from the first control region and from the second well outside the conduction regions and have a first thickness; and second insulating regions, which separate the floating gate region from the first well outside the first control region and have a second thickness greater than the first thickness.

23 Claims, 7 Drawing Sheets

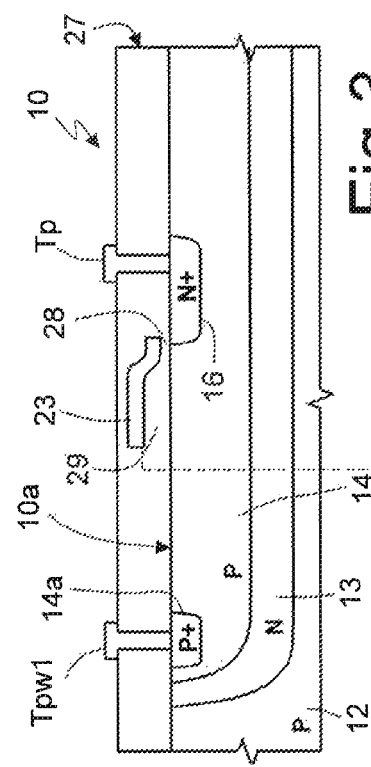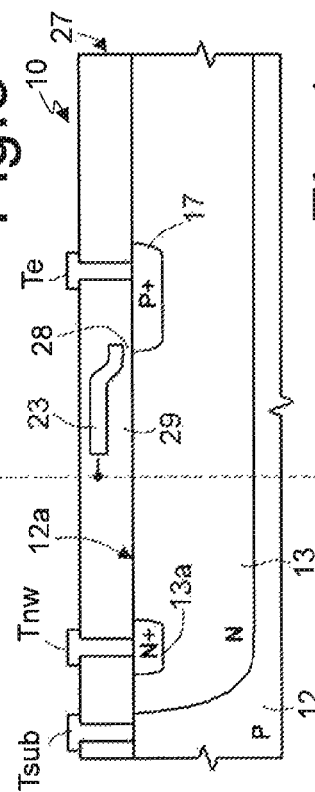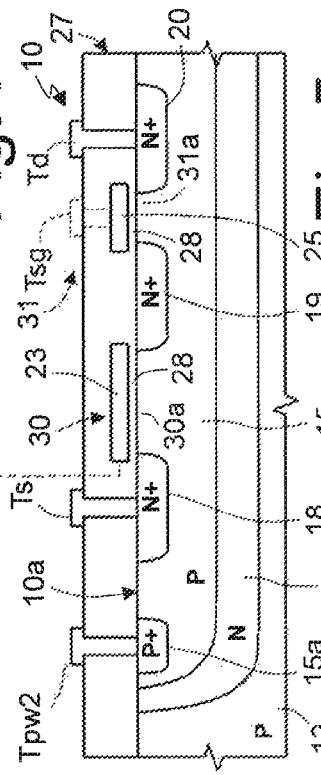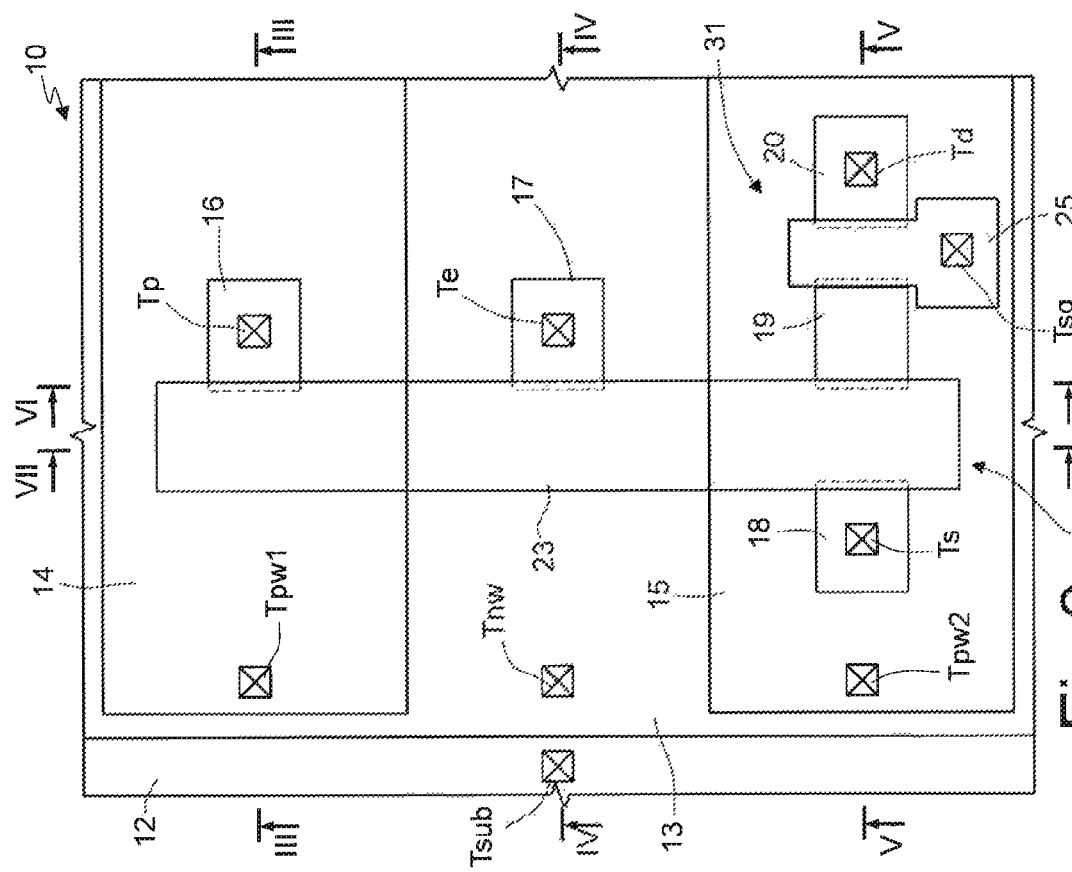

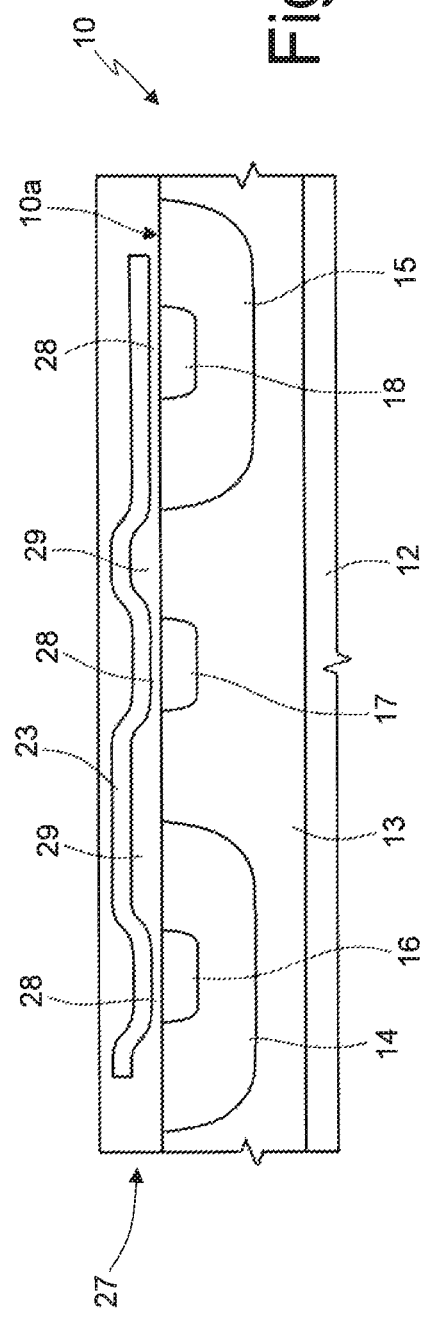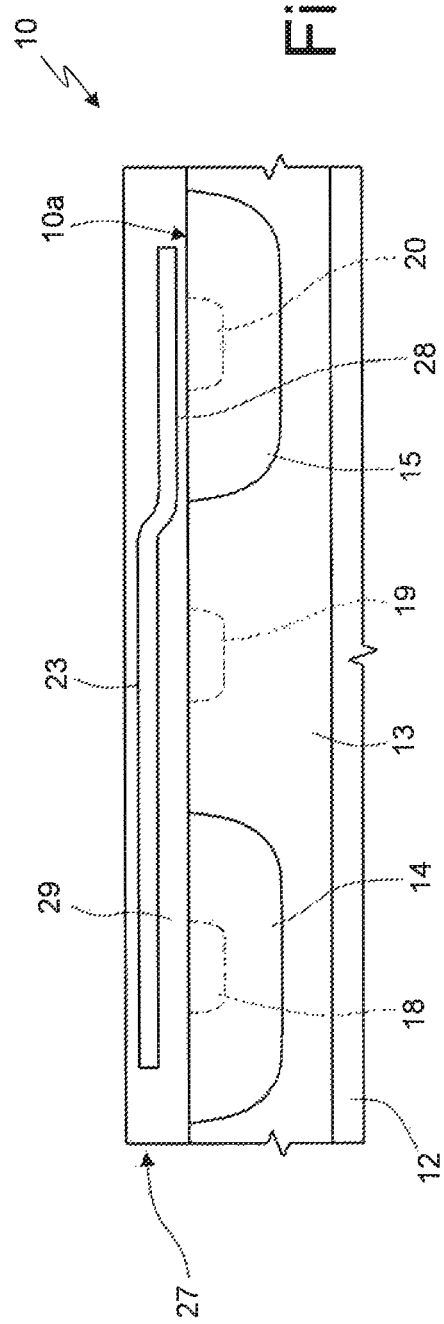

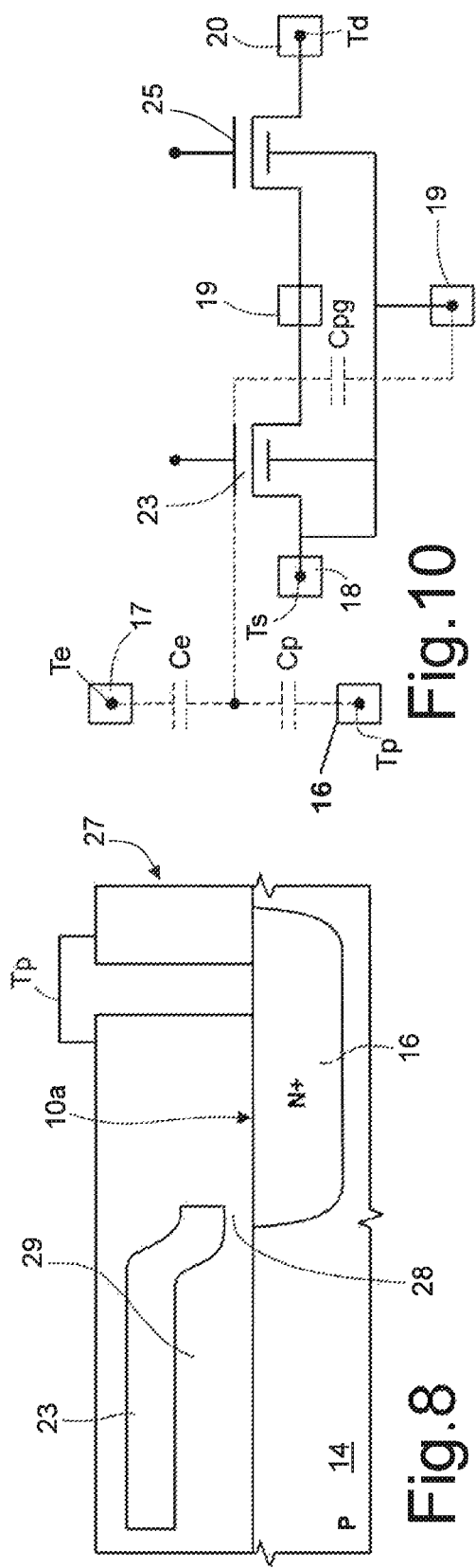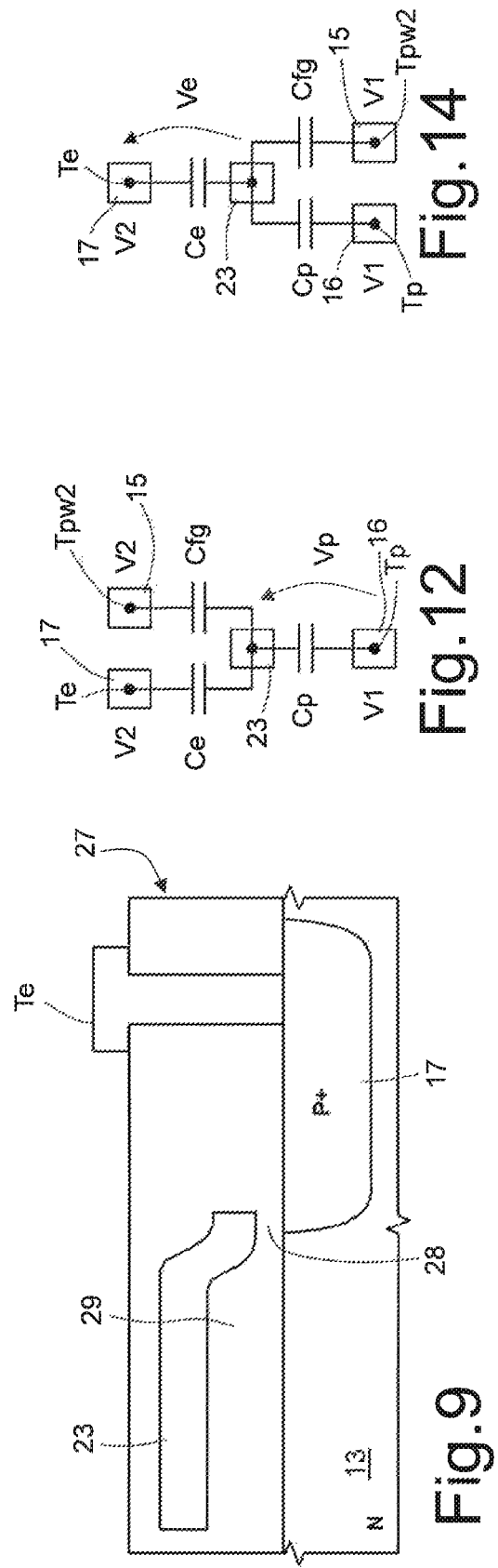

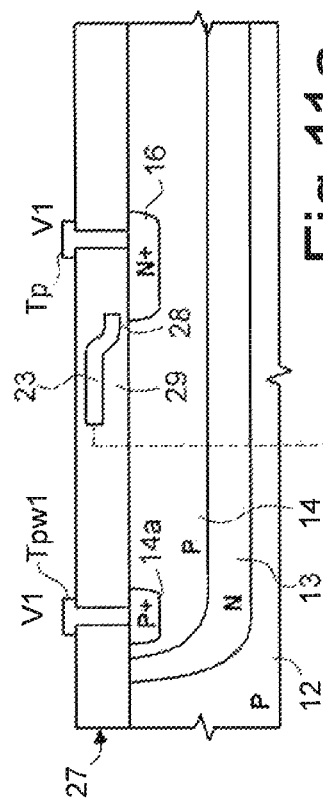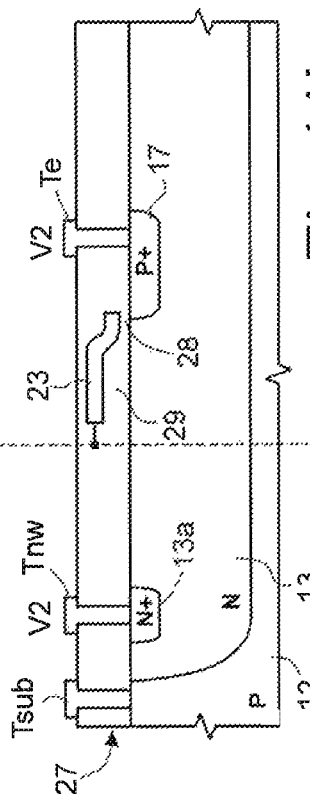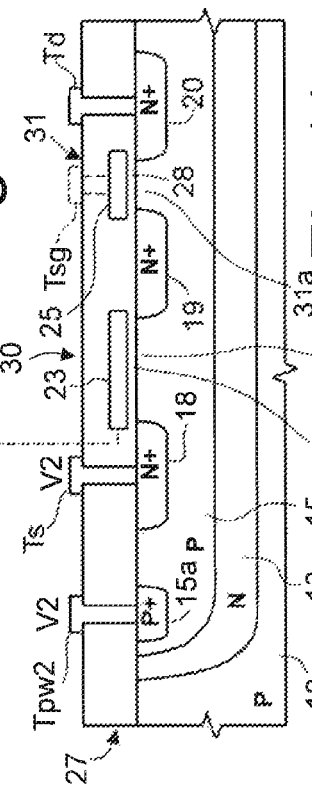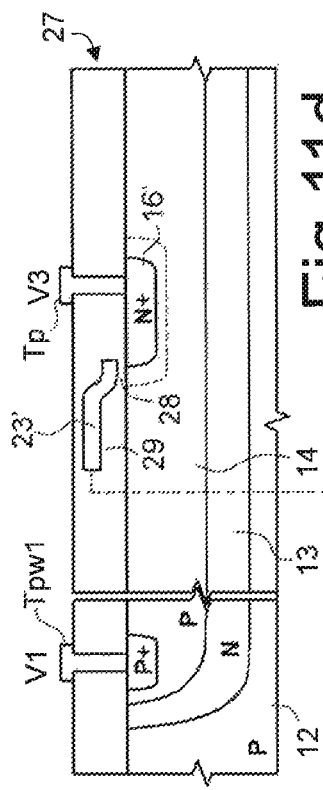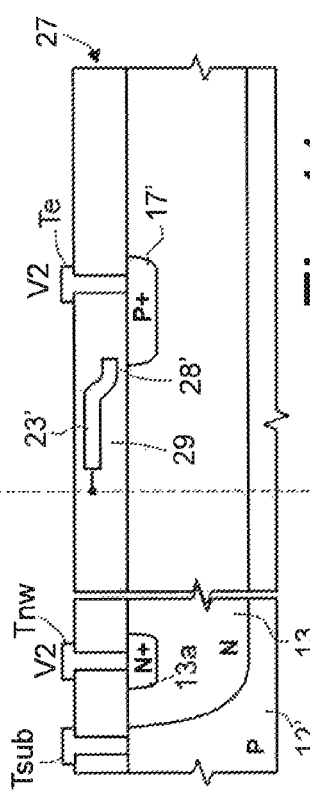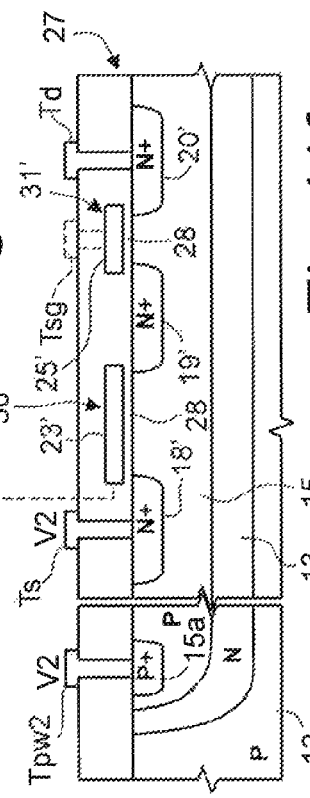

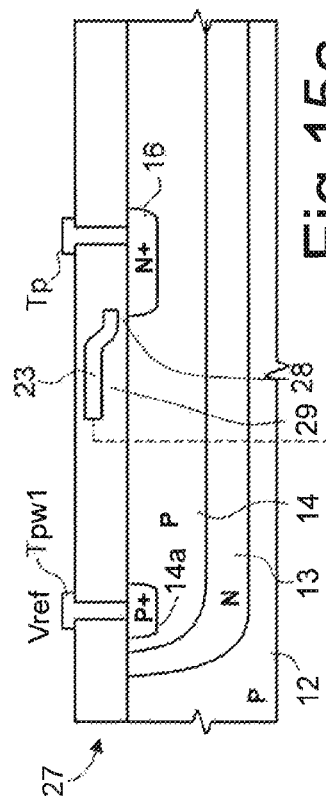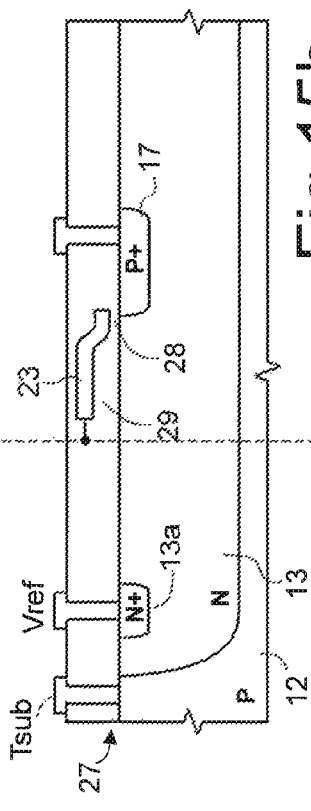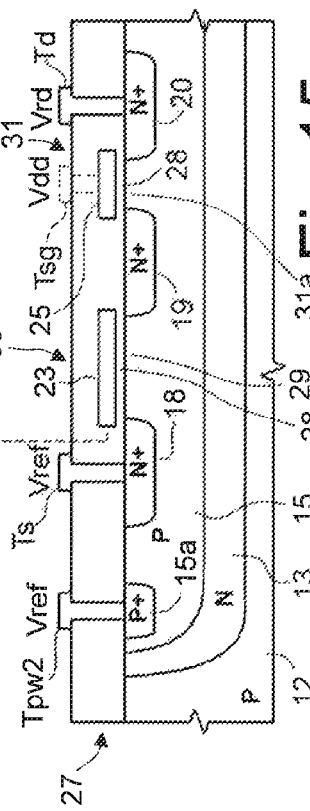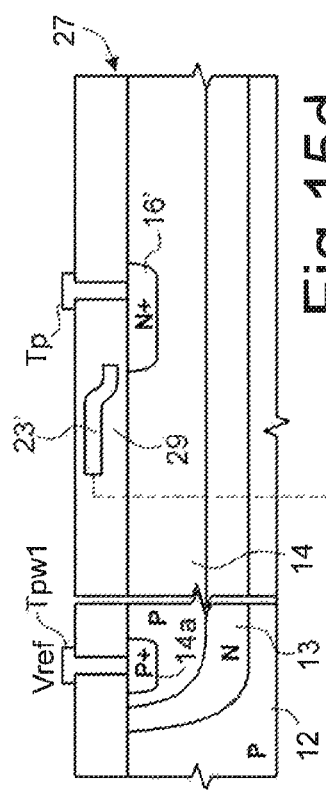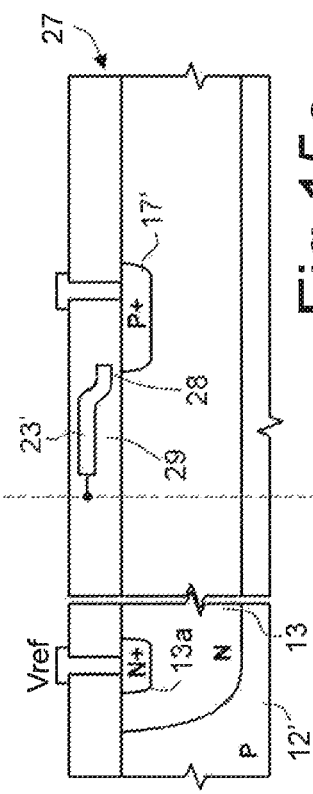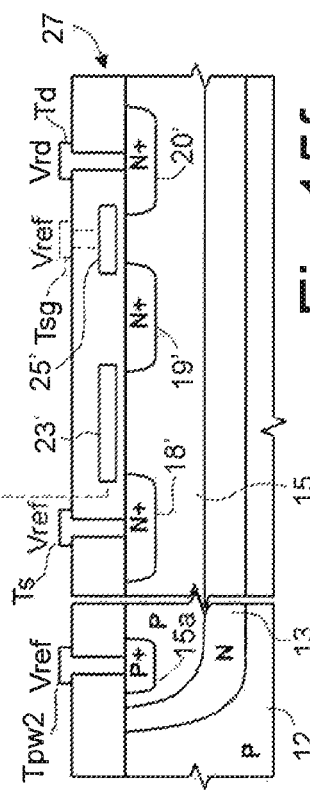

NON-VOLATILE MEMORY DEVICE WITH SINGLE-POLYSILICON-LAYER MEMORY CELLS

PRIORITY CLAIM

The instant application claims priority to Italian Patent Application No., TO2012A000559 filed Jun. 25, 2012, which application is incorporated herein by reference in its entirety.

TECHNICAL FIELD

An embodiment relates to a non-volatile memory device with single-polysilicon-layer memory cells.

BACKGROUND

Numerous integrated electronic devices require a certain amount of non-volatile memory. Normally, non-volatile memory is available in autonomous banks or cards, external to the chips in which the control and processing functions of the devices are integrated. In many cases, however, processing units must be provided with embedded non-volatile memory integrated in the same chips.

The structure of normal autonomous non-volatile memory cells renders, however, problematical integration in the CMOS manufacturing processes, which are widely exploited for producing the processing and control components. In particular, floating-gate cells normally need an additional level of polysilicon with respect to the CMOS process flows. The larger number of machining steps and masks represents an unjustified increase in cost, especially if it is considered that the required amount of integrated non-volatile memory is frequently modest.

Therefore, non-volatile memory cells with different architectures have been developed, in which the floating gate and the gate regions of all the other integrated transistors are made from a single polysilicon layer. In this way, additional steps and masks are avoided, and the integration in the CMOS process flow is much more convenient.

The solution most commonly used is represented by cost-effective non-volatile memory cells, each of which uses a first selection MOS transistor, a second MOS transistor for program, erase, and read operations, and a third MOS transistor for capacitively coupling the floating gate with a region or a control line. Programming of cost-effective cells is carried out by injection of hot electrons, whereas erasure exploits the Fowler-Nordheim tunneling effect. Memory cells of this type favor programming speed, but penalize both the consumption of current, which is rather high, and the occupation of area. Moreover, the maximum number of erasure and programming cycles is rather limited, and is much lower as compared to the cells of autonomous non-volatile memories.

Fowler-Nordheim memory cells exploit the Fowler-Nordheim effect both for programming and for erasure. The fact of not resorting to the injection of hot electrons enables reduction of the consumption levels during programming as compared to cost-effective cells. Fowler-Nordheim cells enable a higher level of parallelism to be achieved during programming, and are more robust from the standpoint of the maximum number of programming and erasure cycles. However, the area occupied is still rather high and does not depart significantly from that of cost-effective cells that exploit injection of hot electrons.

To overcome this drawback, modified Fowler-Nordheim memory cells have been proposed, in which, however, the reduction of area occupied is at the expense of the robustness in the maximum number of programming and erasure cycles.

SUMMARY

An embodiment is a non-volatile memory device that is free from the limitations described and, in particular, enables a combination of high robustness in the maximum number of programming and erasure cycles and low area occupation.

BRIEF DESCRIPTION OF THE DRAWINGS

For a better understanding of the concepts disclosed herein, one or more embodiments are now described, purely by way of non-limiting example, with reference to the attached drawings, wherein:

FIG. 2 is a top plan view of a portion of a memory array, incorporated in the device of FIG. 1, according to an embodiment;

FIG. 3 is a first cross section through the non-volatile memory array of FIG. 2, taken along the line III-III of FIG. 2, according to an embodiment;

FIG. 4 is a second cross section through the memory array of FIG. 2, taken along the line IV-IV of FIG. 2, according to an embodiment;

FIG. 5 is a third cross section through the memory array of FIG. 2, taken along the line V-V of FIG. 2, according to an embodiment;

FIG. 6 is a fourth cross section through the memory array of FIG. 2, taken along the line VI-VI of FIG. 2, according to an embodiment;

FIG. 7 is a fifth cross section through the memory array of FIG. 2, taken along the line VII-VII of FIG. 2, according to an embodiment;

FIG. 8 is an enlarged detail of the view of FIG. 3, according to an embodiment;

FIG. 9 is an enlarged detail of the view of FIG. 4, according to an embodiment;

FIG. 10 is a simplified electrical diagram of a non-volatile memory cell incorporated in the memory array of FIG. 2, according to an embodiment;

FIG. 11a is a first cross section of a memory cell of the array of FIG. 2, in a first operating condition, according to an embodiment;

FIG. 11b is a second cross section of the memory cell of FIG. 2, in the first operating condition, according to an embodiment;

FIG. 11c is a third cross section of the memory cell of FIG. 2, in the first operating condition, according to an embodiment;

FIG. 11d is a first cross section of a further memory cell of the array of FIG. 2, in the first operating condition, according to an embodiment;

FIG. 11e shows a second cross section of the memory cell of FIG. 2, in the first operating condition, according to an embodiment;

FIG. 11f shows a third cross section of the memory cell of FIG. 2, in the first operating condition, according to an embodiment;

FIG. 12 is a simplified electrical diagram representing the memory cells of FIGS. 11a-11c in the first operating condition, according to an embodiment;

FIG. 14 is a simplified electrical diagram representing the memory cells of FIGS. 13a-13c in the second operating condition, according to an embodiment;

FIG. 15a is a first cross section of a memory cell of the array of FIG. 2, in a third operating condition, according to an embodiment;

FIG. 15b is a second cross section of the memory cell of FIG. 2, in the third operating condition, according to an embodiment;

FIG. 15c is a third cross section of the memory cell of FIG. 2, in the third operating condition, according to an embodiment;

FIG. 15d is a first cross section of a further memory cell of the array of FIG. 2, in the third operating condition, according to an embodiment;

FIG. 15e is a second cross section of the memory cell of FIG. 2, in the third operating condition, according to an embodiment; and FIG. 15f is a third cross section of the memory cell of FIG. 2, in the third operating condition, according to an embodiment.

DETAILED DESCRIPTION

Figure 1:
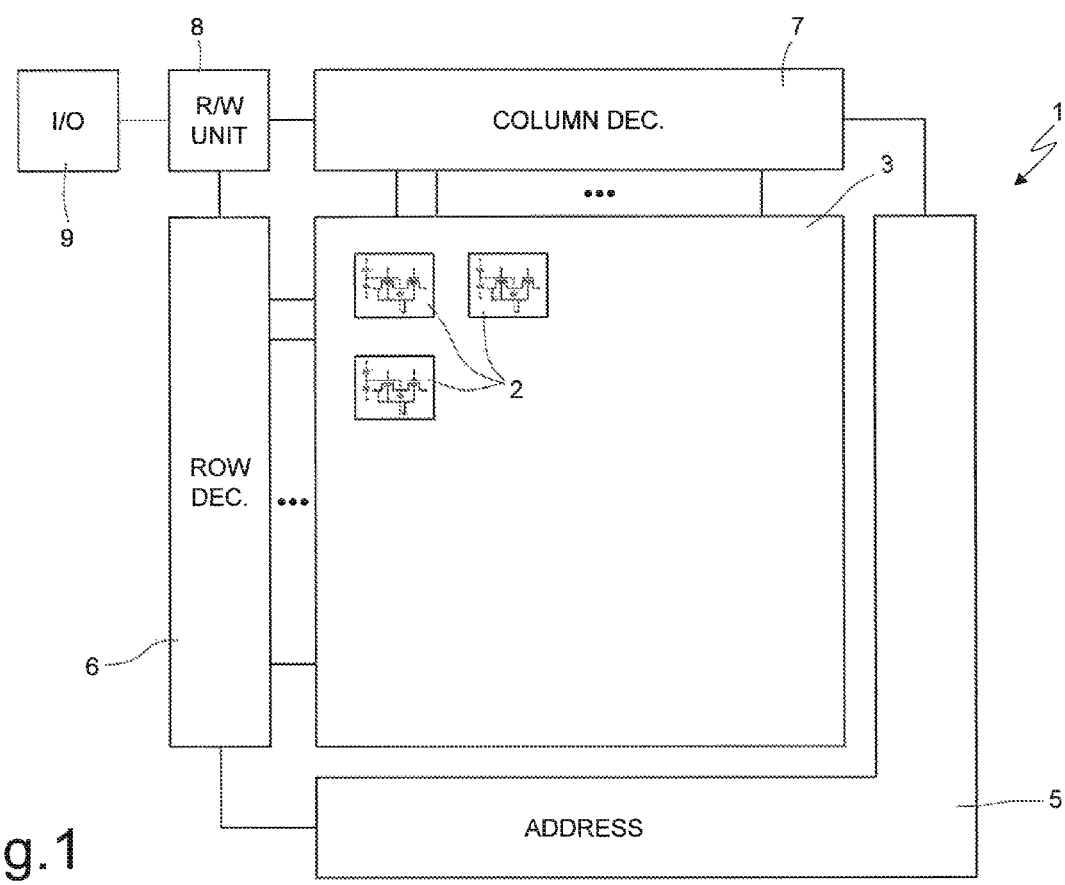
FIG. 1 is a block diagram of a non-volatile memory device, according to an embodiment.

With reference to FIG. 1, a non-volatile memory device having a single polysilicon layer is designated by the number 1 and includes a plurality of memory cells 2 organized in rows and columns (for example, 128-512 rows and 512-1024 columns) so as to form an array 3. The memory cells 2 are based upon floating-gate MOS transistors, the threshold voltage of which is determined by the amount of charge stored on the respective floating gate.

Each memory cell 2 can be read, erased, and programmed individually for storing logic values corresponding to one or more bits. In particular, on the floating gate of each memory cell 2 there can be stored $2^N$ levels of charge, indicating N bits of information. In what follows, for simplicity, reference will be made to two-level one-bit memory cells, without this in and of itself implying any limitation.

By convention, a logic value "0" is stored in memory cells 2 programmed so as to have a first, high, threshold, and a logic value "1" is stored in memory cells 2 erased so as to have a second, low, threshold, lower than the first threshold.

The memory device 1 includes an address buffer 5, a row decoder 6, a column decoder 7, a read/write unit 8, and an input/output buffer 9 (hereinafter, the term "write" will be used to indicate indifferently operations of programming and of erasure of the memory cells 2).

The address buffer 5 receives a memory-cell address 2 selected in a page of the array 3. A row portion and a column portion of the address are supplied, respectively, to the row decoder 6 and to the column decoder 7, which select a corresponding row and a corresponding column of the array 3.

The read/write unit 8 controls the row decoder 6 and the column decoder 7 and is provided with the components necessary for read, erase, and program operations of the memory cells 2 (such as, for example, a power-supply-managing unit equipped with charge pumps, sense amplifiers, comparators, reference cells, and signal generators). The read/write unit 8 is coupled to the input/output buffer 9, for receiving words to be written in the array 3 and supplying to the outside words read from the array 3.

FIGS. 2-5 show a portion of a semiconductor chip 10 that accommodates the memory device 1. More precisely, FIGS. 2-5 show a portion of the array 3 containing a generic memory cell 2.

The memory device 1 is accommodated on the semiconductor chip 10, which includes a monocrystalline semiconductor layer, here a substrate 12 having a first type of conductivity; in particular, in the example described, the substrate 12 is of a P type. The substrate 12 accommodates an N-well 13, having a second of type of conductivity (in the example, of an N type), opposite to the first type of conductivity. Moreover, the substrate 12 is provided with a substrate terminal Tsub, defined by a conductive metal pad, arranged outside the N-well 13. In an embodiment, the N-well 13 accommodates the entire array 3. Alternatively, the memory device may include a plurality of N-wells, each of which accommodates a respective sector or a respective row of the non-volatile memory array.

The N-well 13, which is provided with a contact region 13a of an N+ type and with a corresponding terminal Tnw, extends into the substrate 12 starting from a surface 12a of the substrate 12 itself and accommodates the memory cells 2 of the array 3.

More precisely, arranged in the N-well 13 are a plurality of first P-wells 14 (just one of which is visible in FIGS. 2-5) and a plurality of second P-wells 15, which extend parallel through the entire array 3 and have the first type of conductivity. A first P-well 14 and a second P-well 15, which are adjacent, are common to the memory cells 2 arranged on one and the same row. The first P-wells 14 and the second P-wells 15 are provided with respective contact regions 14a, 15a of a P+ type and with corresponding terminals Tpw1, Tpw2.

Each memory cell 2 includes elements arranged in a respective first P-well 14, elements arranged in a respective second P-well 15, and elements arranged in a portion of the N-well 13 between the respective first P-well 14 and the respective second P-well 15.

In detail, the memory cell 2 includes a plurality of conductive regions 16-20, which extend from the surface 12a towards the inside of the substrate 12, a floating gate region 23, and a selection gate region 25.

The conductive regions include a first write region or program region 16, a second write region or erase region 17, a first conduction region 18, a second conduction region 19, and a third conduction region 20.

The program region 16, of an N+ type, is accommodated in the first P-well 14 and has a terminal Tp. The erase region 17, which is of a P+ type, is accommodated in the N-well 13, between the first P-well 14 and the second P-well 15, and has a terminal Te. The first conduction region 18, the second conduction region 19, and the third conduction region 20 are all of an N+ type and are accommodated in the second P-well 15. The first conduction region 18 and the third conduction region 20 are provided with respective terminals Ts, Td. In an embodiment, moreover, the program region 16, the erase region 17, and the second conduction region 19 are aligned in the direction of the columns of the array 3, i.e., in a direction perpendicular to the first P-well 14 and to the second P-well 15. The first conduction region 18, the second conduction region 19, and the third conduction region 20 are instead aligned in the direction of the rows of the array 3, i.e., in a direction parallel to the first P-well 14 and to the second P-well 15.

The floating-gate region 23, which is made of polycrystalline silicon, extends in a direction transverse to the first P-well 14 and to the second P-well 15 and is incorporated in an insulating structure 27 made of silicon oxide, which coats the chip 10 and includes thin gate-oxide regions and thick field-oxide regions, as described hereinafter. The floating-gate region 23 lies in part above the first P-well 14, where it is adjacent to and slightly overlaps the program region 16, and in part above the second P-well 15, where it is adjacent to and slightly overlaps the first conduction region 18 and the second conduction region 19, and on a portion of the N-well 13 between the first P-well 14 and the second P-well 15. Here, the floating-gate region 23 is adjacent to and slightly overlaps the erase region 17. For example, the degrees of overlapping of the floating gate region 23 with respect to the program region 16, the erase region 17, the first conduction region 18, and the second conduction region 19 are determined by the diffusion of the conductive regions (after the required implantations) and may be comparable to the degree of overlapping of the gate region with respect to the source and drain regions in normal MOS transistors that can be obtained with CMOS technology.

As illustrated in FIGS. 3-5 and more in detail in FIGS. 6-9, the floating-gate region 23 is not planar and is separated from the substrate 12 and from the conductive regions obtained therein by portions of the insulating structure 27 of different thickness. More precisely, portions of the floating gate 23 that are to provide capacitive coupling with the underlying conductive regions for program, erasure, and read operations are separated from the substrate 12 by gate oxide regions 28, which have a thickness D1, for example, in a range of approximately 3 nanometers (nm) and 200 nm. Consequently, gate-oxide regions 28 are present: in the area of overlapping between the floating-gate region 23 and the program region 16; in the area of overlapping between the floating-gate region 23 and the erase region 17; and between the floating-gate region 23 and the portion of the second P-well 15 between the first conduction region 18 and the second conduction region 19, as well as the area of overlapping with the latter. In an embodiment, the gate-oxide region 28 that separates the floating-gate region 23 from the second P-well 15 is limited to the portion of the second P-well 15 between the first conduction region 18 and the second conduction region 19.

Elsewhere, the floating-gate region 23 is separated from the substrate 10 by field-oxide regions 29, which have a thickness D2 greater than the thickness D1 of the gate oxide regions 28 (for example, in a range of approximately 0.3 microns (μm) to 5 μm). The field-oxide regions 29, like the gate-oxide regions 28, extend from the surface 12a of the substrate 12 outwards. The field-oxide regions 29 are hence projecting with respect to the gate-oxide regions 28. The transition between the gate-oxide regions 28 and the field-oxide regions 29 is made so as to minimize the capacitive coupling between the floating-gate region 23 and portions of the N-well 13 and of the first P-well 14 external to the program region 16 and to the erase region 17. The floating-gate region 23 extends conformably on the gate-oxide regions 28, on the field-oxide regions 29, and on the areas of transition from the regions 28 to the regions 29.

In an embodiment, at least some of the field-oxide regions 29 are replaced by STI (shallow-trench isolation) regions. In this case, the floating-gate region 23 may be planar, but in any case the thickness of the insulation is smaller between the floating-gate region and the areas of overlapping with the program region 16 and with the erase region 17 (gate-oxide regions) than elsewhere (thick-oxide regions).

In an embodiment described, the program region 16 and the erase region 17 are aligned with respect to one another and are thus on the same side of the floating-gate region 23. In an alternative embodiment, however, the program region 16 and the erase region 17 can be on opposite sides of the floating-gate region 23.

In any case, both in the first P-well 14 for the program region 16 and in the N-well 13 for the erase region 17, the capacitive coupling with the floating-gate region 23 is provided along just one respective side of the floating-gate region 23, where a respective one of the gate-oxide regions 28 is present, whereas the rest of the floating-gate region 23, where field-oxide regions 29 are present, is decoupled (at the voltages available and, in general, at the voltages normally used in memory devices) from the portions of the underlying substrate 12 and from the conductive regions obtained therein (N-well 13, first P-well 14, program region 16, and erase region 17).

The selection-gate region 25, which is provided with a terminal Tsg, is arranged between the second conduction region 19 and the third conduction region 20 and is separated from the substrate 15 by a further gate-oxide region 28.

As illustrated schematically in FIG. 10, in practice, the first conduction region 18, the second conduction region 19, and the third conduction region 20, with the floating-gate region 23 and with the selection-gate region 25, form a memory MOS transistor 30 and a selection MOS transistor 31. More precisely, the first conduction region 18, the second conduction region 19, and the floating-gate region 23 form the memory MOS transistor 30, while the second conduction region 19, the third conduction region 20, and the selection-gate region 25 form the selection MOS transistor 31. The second conduction region 19 is hence shared and forms the drain region of the memory MOS transistor 30 and the source region of the selection MOS transistor 31. Furthermore, the second P-well 15 defines a body region both for the memory MOS transistor 30 and for the selection MOS transistor 31. Portions of the P-well 15 between the first conduction region 18 and the second conduction region 19 define a channel region 30a of the memory MOS transistor 30; portions of the P-well 15 between the second conduction region 19 and the third conduction region 20 define a channel region 31a of the selection MOS transistor 31.

Furthermore, the floating-gate region 23 is capacitively coupled to the program region 16 and to the erase region 17, as well as to the second P-well 15. A program capacitance Cp is present between the floating-gate region 23 and the program region 16, whilst an erase capacitance Ce is present between the floating-gate region 23 and the erase region 17. The program capacitance Cp and the erase capacitance Ce are determined basically by the areas of overlapping of the floating-gate region 23 with respect to the program region 16 and to the erase region 17. In an embodiment, the program capacitance Cp and the erase capacitance Ce are approximately identical.

Instead, between the floating-gate region 23 and the second P-well 15 there is a floating-gate capacitance Cfg, which is determined to a lesser extent by areas of overlapping of the first conduction region 18 and the second conduction region 19 and, principally, by overlapping of the channel region 30a.

The floating-gate capacitance Cfg is hence much greater than the program capacitance Cp and the erase capacitance Ce.

Program, erase, and read operations of the memory cells 2 are executed as described hereinafter by the read/write unit 8, which brings onto the terminals of the memory cells 2 appropriate voltages through the row decoder 6 and the column decoder 7. The read/write unit 8 moreover maintains the N-well 13 and the substrate 12, respectively, at the highest available voltage (for example, a positive supply voltage of 5 V) and at the lowest available voltage (for example, a negative supply voltage of −5 V), respectively, to reverse bias the junction between the N-well 13 and the substrate 12.

During a program operation (see FIGS. 11a-11f), the first P-well 14 and the second P-well 15 associated with a selected memory cell 2 (FIGS. 11a-11c) receive through the terminals Tpw1, Tpw2, respectively, a first voltage V1, for example −5 V, and a second voltage V2, greater than the first voltage V1, for example +5 V. The first voltage V1 is supplied also to the program region 16 of the selected memory cell 2, whilst the second voltage V2 is supplied to the erase region 17 (through the terminal Te) and to the first conduction region 18 (through the terminal Ts). The third conduction region 20 and the selection-gate region 25 are left floating.

FIGS. 11d-11f show a memory cell 2' of the row to which the selected memory cell 2 belongs. Except for the program region 16', the other regions of the deselected memory cell 2' receive the same voltages as the corresponding regions of the selected memory cell 2. The program region 16' receives, instead, a third voltage V3, intermediate between the first voltage V1 and the second voltage V2 and closer to the second voltage V2 than to the first voltage V1 (for example, +2 V).

The conditions described provide that the PN junctions defined between the N-well 13, the substrate 12, the first P-well 14, and the second P-well 15 are reversed biased or are set at the same voltage so as to prevent triggering of parasitic currents.

The selection MOS transistor 31 is inhibited both in the selected memory cell 2 and in the deselected memory cells 2', and hence circulation of current is prevented.

Furthermore, in the selected memory cell 2, the floating-gate region 23 is subject to voltages that cause an injection of charge by the Fowler-Nordheim tunnel effect from the program region 16 through the corresponding gate oxide region 28.

As already described, the floating-gate region 23 is capacitively coupled to the program region 16, to the erase region 17, and to the second P-well 15, respectively, through the program capacitance Cp, the erase capacitance Ce, and the floating-gate capacitance Cfg. The voltage drop on the various capacitances (and hence on the respective gate-oxide regions 28) is determined by a capacitive divider, taking into account that the erase capacitance Ce and the floating gate capacitance Cfg are coupled in parallel, since the erase region 17 and the second P-well 15 are both set at the second voltage V2.

In particular, the program voltage Vp on the program capacitance Cp (FIG. 12) is given by the following equation:

$$Vp = \frac{Ce + Cfg}{Cp + Ce + Cfg}(V2 - V1) \quad (1)$$

The floating-gate capacitance Cfg is much greater than both the program capacitance Cp and the erase capacitance Ce. In fact, the program capacitance Cp and the erase capacitance Ce are each comparable with the contribution to the floating-gate capacitance Cfg provided by the overlapping of the floating-gate region 23 with the first conduction region 18 or the second conduction region 19. The floating-gate capacitance, however, has a further dominant contribution due to overlapping of the floating-gate region 23 with the channel region 30a.

For this reason, the program voltage Vp on the program capacitance Cp corresponds to a fraction of the available voltage V2-V1 much greater than the voltage that drops across the erase capacitance Ce and across the floating-gate capacitance Cfg.

In the deselected memory cells 2', instead, the floating-gate region 23' is at the third voltage V3, which is close to the second voltage V2. The capacitive division is the same as in the selected memory cell 2, but the total voltage available (V2-V3) is much smaller and is not sufficient to cause injection of charge by the Fowler-Nordheim tunnel effect.

Furthermore, the PN junction defined between the program region 16' of each memory cell 2' and the first P-well 14 is reversed biased. The reverse bias creates a depletion region (indicated dashed in FIG. 11d), which extends into the first P-well 14 and prevents parasitic migration of charge towards the respective floating-gate region 23'. This result is possible because the capacitive coupling of the program (erase) region is substantially due to just the overlap area between the floating-gate region 23' and the program region 16', and decreases rapidly in the first P-well 14 outside the program region 16'. The depletion region extends sufficiently to insulate the portions of the first P-well 14 that are adjacent to the program (erase) region and prevents spurious injections (extractions) of charge into (from) the floating-gate region 23', thus leaving the charge present therein unaltered.

For the memory cells 2 arranged in rows different from the row of the selected memory cell 2, the second P-well 15 may receive a voltage insufficient to give rise to injection of charge into the floating gate region 23 by the Fowler-Nordheim tunnel effect (for example, 0 V).

Figure 13A:
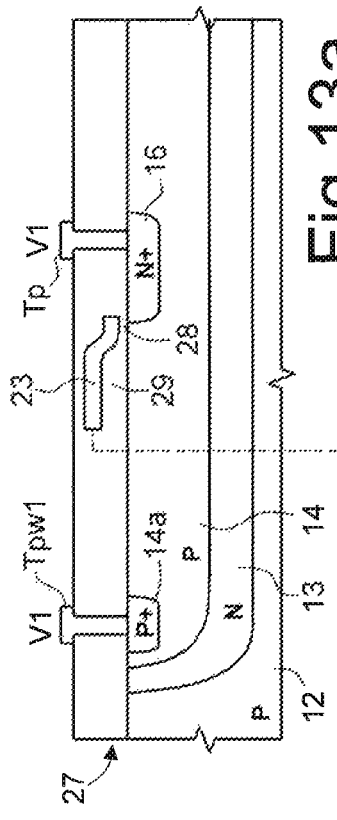
FIG. 13a is a first cross section of a memory cell of the array of FIG. 2, in a second operating condition, according to an embodiment.
Figure 13B:
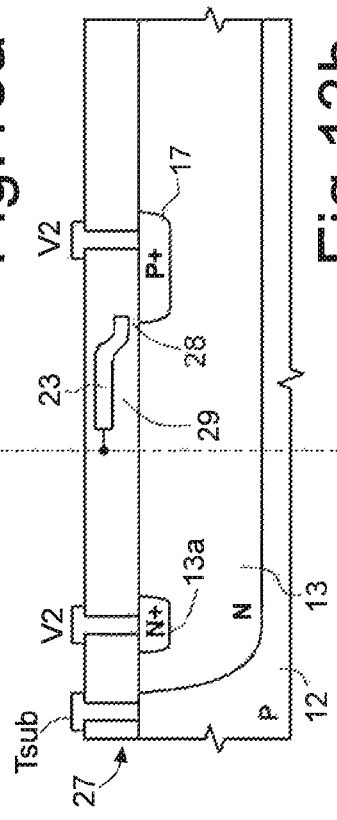
FIG. 13b is a second cross section of the memory cell of FIG. 2, in the second operating condition, according to an embodiment.
Figure 13C:
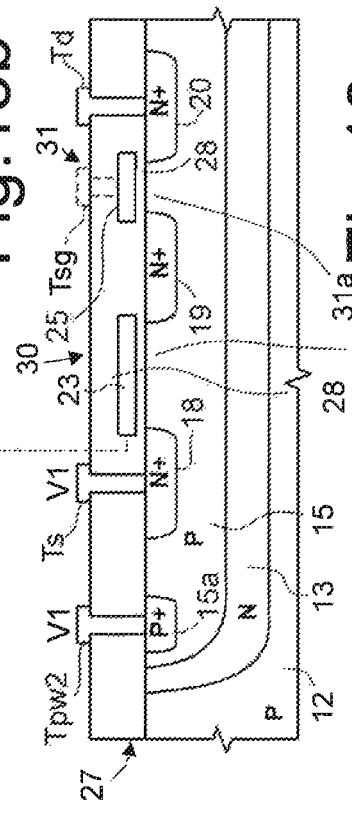
FIG. 13c is a third cross section of the memory cell of FIG. 2, in the second operating condition, according to an embodiment.

During an erase operation (see FIGS. 13a-13f), the first P-well 14 and the second P-well 15 associated with a selected memory cell 2 (FIGS. 13a-13c) both receive the first voltage V1 (−5 V) through the terminals Tpw1, Tpw2. The first voltage V1 is supplied also to the program region 16 and to the first conduction region 18 (through the terminal Ts) and to the selection-gate region 25 (through the terminal Tsg) of the selected memory cell 2, whilst the second voltage V2 (+5 V) is supplied to the erase region 17 (through the terminal Te). The third conduction region 20 and the selection gate region 25 are left floating.

Figure 13D:
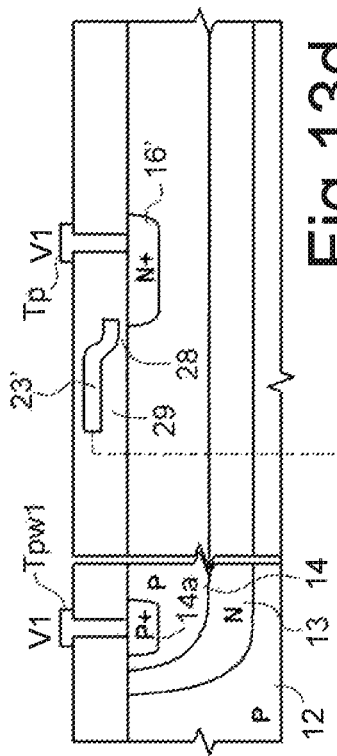
FIG. 13d is a first cross section of a further memory cell of the array of FIG. 2, in the second operating condition, according to an embodiment.
Figure 13E:
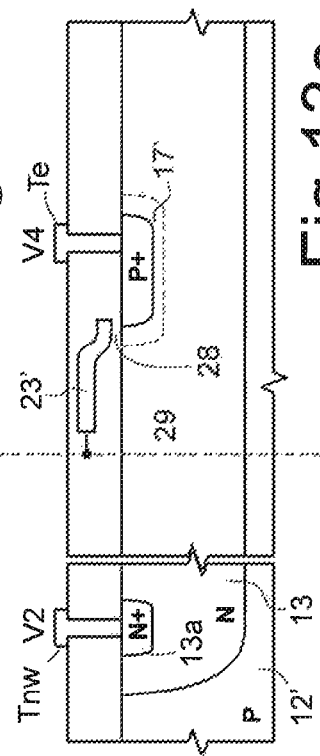
FIG. 13e is a second cross section of the memory cell of FIG. 2, in the second operating condition, according to an embodiment.
Figure 13F:
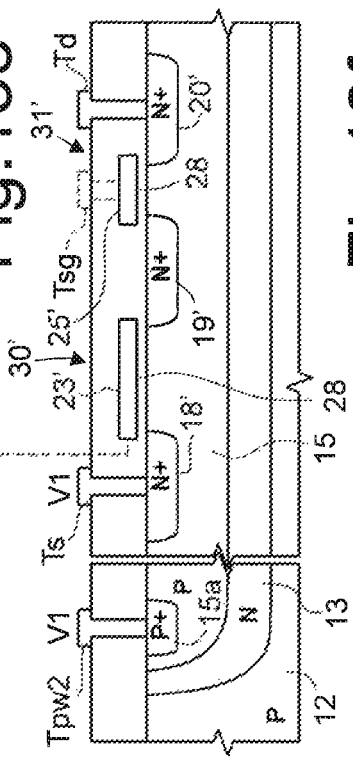
FIG. 13f is a third cross section of the memory cell of FIG. 2, in the second operating condition, according to an embodiment.

FIGS. 13d-13f show a memory cell 2' of the row to which the selected memory cell 2 belongs. Except for the erase region 17', the other regions of the deselected memory cell 2' receive the same voltages as the corresponding regions of the selected memory cell 2. The erase region 17' receives, instead, a fourth voltage V4, intermediate between the first voltage V1 and the second voltage V2 and closer to the first voltage V1 than to the second voltage V2 (for example, −2 V).

The conditions described provide that the PN junctions defined between the N-well 13, the substrate 12, the first P-well 14, and the second P-well 15 are reversed biased or are set at the same voltage so as to prevent triggering of parasitic currents.

The selection MOS transistor 31 is inhibited both in the selected memory cell 2 and in the deselected memory cells 2', and thus the circulation of current is prevented.

Furthermore, in the selected memory cell 2, the floating-gate region 23 is subject to voltages that cause an extraction of charge by the Fowler-Nordheim tunnel effect towards the erase region 17 through the corresponding gate-oxide region 28.

The voltage drop across the program capacitance Cp, across the erase capacitance Ce, and across the floating-gate capacitance Cfg (and hence across the respective gate-oxide regions 28) is determined by a capacitive divider. Taking into account that the program capacitance Cp and the floating-gate capacitance Cfg are coupled in parallel and that the program region 16 and the second P-well 15 are both set at the first voltage V1, the erase voltage Ve present on the erase capacitance Ce (FIG. 14) is given by the following equation:

$$Ve = \frac{Cp + Cfg}{Cp + Ce + Cfg}(V2 - V1) \quad (2)$$

The floating-gate capacitance Cfg is much greater than both the program capacitance Cp and the erase capacitance Ce. For this reason, the erase voltage Ve on the erase capacitance Ce corresponds to a fraction of the voltage V2-V1 available much greater than the voltage that falls on the program capacitance Cp and on the floating-gate capacitance Cfg.

The second P-well 15 is hence used as control gate to carry out, alternatively, programming or erasure of a selected memory cell 2.

In the deselected memory cells 2', instead, the erase region 17' is at the fourth voltage V4, which is close to the first voltage V1. The capacitive division is the same as in the selected memory cell 2, but the total voltage available (V1-V4) is much smaller and is not sufficient to cause extraction of charge by the Fowler-Nordheim tunnel effect.

Furthermore, the PN junction defined between the erase region 17' of each deselected memory cell 2' and the N-well 13 is reversed biased. The reverse biasing creates a depletion region (indicated dashed in FIG. 13e), which extends into the N-well 13 and prevents parasitic migration of charge from the respective floating gate region 23'. This result is possible thanks to the fact that the capacitive coupling of the erase (program) region is substantially limited to the overlap area between the floating-gate region 23' and the erase region 17', moreover decreasing rapidly outside of the N-well 13. The depletion region extends sufficiently to insulate the portions of the N-well 13 that are adjacent to the erase (program) region and prevents spurious injections or extractions, leaving the charge present on the floating-gate region 23' unaltered.

During a read operation (see FIGS. 15a-15f), the N-well 13, the first P-well 14, and the second P-well 15 associated with a selected memory cell 2 (FIGS. 15a-15c) are set at a reference voltage Vref (here 0 V), whilst the program region 16 and the erase region 17 are left floating. The first conduction region 18 and the third conduction region 20 are set, respectively, at the reference voltage Vref and at a read voltage Vrd, greater than the reference voltage Vref (for example, +1 V). The selection-gate region 25 is, instead, set at the maximum voltage available $V_{DD}$ (+5 V), so as to turn on the selection MOS transistor 31. In these conditions, the memory MOS transistor 30 conducts or is inhibited according to whether the floating-gate region 23 has accumulated charge (programmed state) or else is depleted (erased state). The detection of the current on the terminal Td, which functions as a drain terminal of the selection MOS transistor 31, allows determining the state of the selected memory cell 2.

In the deselected memory cells 2', the biasing is the same described for the selected memory cell 2, except for the fact that the selection-gate region 25' is brought to the reference voltage Vref so as to turn off the corresponding selection MOS transistor 31.

As compared to traditional memory cells, an embodiment of the memory cell 2 described enables division in a more advantageous way of the voltages used for programming and erasure on the corresponding capacitances. As compared to traditional memory cells, in fact, the capacitive coupling of the floating-gate region with the programming regions is limited to the respective overlap areas and is hence much weaker, in proportion to the coupling with the second P-well. It may thus be possible to produce lower floating-gate capacitances and, consequently, memory cells with smaller dimensions.

At the level of the entire memory array, the saving of area is considerable and may reach up to approximately 30%. Alternatively, it may be possible to use lower voltages for writing (programming, and erasing) memory cells by the Fowler-Nordheim effect, thus obtaining a significant improvement in terms of consumption levels or a lower complexity and hence smaller area of the external circuits (for example, for the charge pumps).

Modifications and variations may be made to the memory device described, without departing from the scope of the present disclosure.

In particular, it is clear that the memory array can be obtained in a dual way with regions of conductivity opposite to the ones described.

Furthermore, adjacent memory cells can be obtained so as to share one or more of the regions by which they are formed. For example, adjacent cells obtained in the same first P-well and second P-well can share the third conduction region, which forms the drain region of the respective selection transistors.

Moreover, an array of non-volatile memory cells such as described above may be included on an integrated circuit, and this integrated circuit may be coupled to one or more other integrated circuits to form a system, where at least one of the integrated circuit and one of the other integrated circuits may be a computing circuit such as a microprocessor or microcontroller.

From the foregoing it will be appreciated that, although specific embodiments have been described herein for purposes of illustration, various modifications may be made without deviating from the spirit and scope of the disclosure. Furthermore, where an alternative is disclosed for a particular embodiment, this alternative may also apply to other embodiments even if not specifically stated.

The invention claimed is:

1. A non-volatile memory cell, comprising:
 a first well region;
 first and second source-drain regions disposed in the well region;
 a first body region disposed in the well region between the first and second source-drain regions;
 first and second program-erase regions; and
 a floating gate disposed over the body region and the first and second program-erase regions, the floating gate configured to acquire a program charge in response to a first voltage on the first well region and the first program-erase region and a second voltage on the second program-erase region, and to acquire an erase charge in response to a third voltage on the first well region and the second program-erase regions and a fourth voltage on the first program-erase region.

2. The non-volatile memory cell of claim 1, further comprising an insulator disposed between the floating gate and the first and second drain regions, the body region, and the first and second program-erase regions.

3. The non-volatile memory cell of claim 1 wherein:
the first well region has a first type of conductivity;
the first and second source-drain regions have a second type of conductivity;
the first program-erase region has the first type of conductivity; and
the second program-erase region has the second type of conductivity.

4. The non-volatile memory cell of claim 1 wherein:
the first well region has a P-type conductivity;
the first and second source-drain regions have an N-type conductivity;
the body region has a P-type conductivity;
the first program-erase region has a P-type conductivity; and
the second program-erase region has an N-type conductivity.

5. The non-volatile memory cell of claim 1 wherein:
the third voltage equals the second voltage; and
the fourth voltage equals the first voltage.

6. The non-volatile memory cell of claim 1, further comprising:
a second well region of a first type of conductivity;
the first well region and a third well region disposed in the second well region and of a second type of conductivity;
wherein the first program-erase region is disposed in the second well region and is of the second type of conductivity; and
wherein the second program-erase region is disposed in the third well region and is of the first type of conductivity.

7. The non-volatile memory cell of claim 1, further comprising:
a second well region of a first type of conductivity;
the first well region and a third well region disposed in the second well region and of a second type of conductivity;
wherein the first program-erase region is disposed in the second well region and is of the second type of conductivity;
wherein the second program-erase region is disposed in the third well region and is of the first type of conductivity; and
wherein the floating gate includes a first portion disposed a first distance over the body region, a second portion disposed a second distance over the second well region, a third portion disposed approximately the first distance over the first program-erase region, a fourth portion disposed approximately the second distance over the third well region, and a fifth portion disposed approximately the first distance over the second program-erase region.

8. The non-volatile memory cell of claim 1, further comprising:
a third source-drain region;
a second body region disposed in the first well region between the second and third source-drain regions; and
an access gate disposed over the second body region.

9. An integrated circuit, comprising:
an array of non-volatile memory cells, at least one of non-volatile memory cell including
a well region;
first and second source-drain regions disposed in the well region;
a body region disposed in the well region between the first and second source-drain regions;
first and second program-erase regions; and
a floating gate disposed over the body region and the first and second program-erase regions, the floating gate configured to acquire a program charge in response to a first voltage on the well region and the first program-erase region and a second voltage on the second program-erase region, and to acquire an erase charge in response to a third voltage on the well region and the second program-erase region and a fourth voltage on the first program-erase region.

10. The integrated circuit of claim 9, further comprising:
a row decoder coupled to the array;
a column decoder coupled to the array;
a read-write unit coupled to the array; and
a program-erase circuit coupled to the array.

11. A system, comprising:
a first integrated circuit, including
an array of non-volatile memory cells, at least one of non-volatile memory cell including
a well region;
first and second source-drain regions disposed in the well region,
a body region disposed in the well region between the first and second source-drain regions;
first and second program-erase regions, and
a floating gate disposed over the body region and the first and second program-erase regions, the floating gate configured to acquire a program charge in response to a first voltage on the well region and the first program-erase region and a second voltage on the second program-erase region, and to acquire an erase charge in response to a third voltage on the well region and second program-erase region and a fourth voltage on the first program-erase region; and
a second integrated circuit coupled to the first integrated circuit.

12. The system of claim 11 wherein at least one of the first and second integrated circuits includes a computing circuit.

13. The system of claim 11 wherein the first and second integrated circuits are disposed on a same die.

14. The system of claim 11 wherein the first and second integrated circuits are disposed on respective dies.

15. A method, comprising:
coupling a first voltage to respective first nodes of first and second capacitors that include a floating gate of a non-volatile memory cell as a common second node;
coupling a second voltage to a respective first node of a third capacitor that includes the floating gate as a second node; and
changing a threshold voltage of the non-volatile memory cell in response to the first and second voltages.

16. The method of claim 15 wherein changing the threshold voltage includes programming the non-volatile memory cell.

17. The method of claim 15 wherein changing the threshold voltage includes erasing the non-volatile memory cell.

18. The method of claim 15 wherein:
the first voltage is higher than the second voltage; and
changing the threshold voltage includes programming the non-volatile memory cell.

19. The method of claim 15 wherein:
the first voltage is lower than the second voltage; and
changing the threshold voltage includes erasing the non-volatile memory cell.

20. The method of claim 15 wherein changing the threshold voltage includes changing an amount of charge on the floating gate.

21. A non-volatile memory cell, comprising:
a first well region;
a second well region spaced apart from the first well region;
first and second source-drain regions disposed in the first well region;
a body region disposed in the first well region between the first and second source-drain regions;
a first program-erase region disposed in the second well region; and
a floating gate having a first portion disposed a first distance over the body region, a second portion disposed a second distance over the second well region, and a third portion disposed approximately the first distance over the first program-erase region, the second distance greater than the first distance.

22. The non-volatile memory cell of claim 21, further comprising an insulator disposed between the floating gate and the first and second well regions.

23. The non-volatile memory cell of claim 21, further comprising:
a third well region;
wherein the first and second well regions are disposed in the third well region;
a second program-erase region disposed in the third well region between the first and second well regions; and
wherein the floating gate has a fourth portion disposed approximately the second distance over the third well region between the first and second well regions and having a fifth portion disposed approximately the first distance over the second program-erase region.

* * * * *